United States Patent [19]

Mydill et al.

[11] Patent Number: 4,870,346
[45] Date of Patent: Sep. 26, 1989

[54] DISTRIBUTED PSEUDO RANDOM SEQUENCE CONTROL WITH UNIVERSAL POLYNOMIAL FUNCTION GENERATOR FOR LSI/VLSI TEST SYSTEMS

[75] Inventors: Marc R. Mydill, Garland; Theo J. Powell, Dallas, both of Tex.

[73] Assignee: Texas Instruments Incorporated, Dallas, Tex.

[21] Appl. No.: 96,703

[22] Filed: Sep. 14, 1987

[51] Int. Cl.$^4$ ................... G01R 31/28; G06F 11/00
[52] U.S. Cl. ................... 324/73 R; 371/27
[58] Field of Search ............ 324/73 R, 73 AT; 371/24–27, 20

[56] References Cited

U.S. PATENT DOCUMENTS

| | | | |
|---|---|---|---|
| 3,924,181 | 12/1975 | Alderson | 371/27 |
| 4,222,514 | 9/1980 | Bass | 371/27 |
| 4,503,536 | 3/1985 | Panzer | 371/25 |
| 4,519,078 | 5/1985 | Komonytsky | 371/27 X |
| 4,670,877 | 6/1987 | Nishibe | 371/27 X |
| 4,745,355 | 5/1988 | Eichelberger et al. | 324/73 R |
| 4,745,603 | 5/1988 | Shedd | 371/27 |

Primary Examiner—Gerard R. Strecker
Attorney, Agent, or Firm—B. Peter Barndt; James T. Comfort; Melvin Sharp

[57] ABSTRACT

Simple polynomial function generators are used to generate pseudo random test patterns and perform signature analysis on a per pin basis in the control logic in LSI/VLSI test systems.

22 Claims, 4 Drawing Sheets

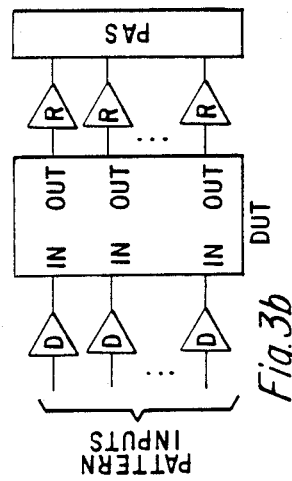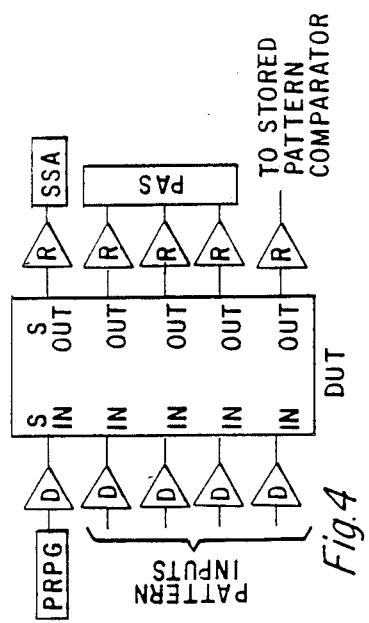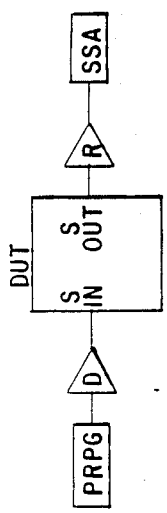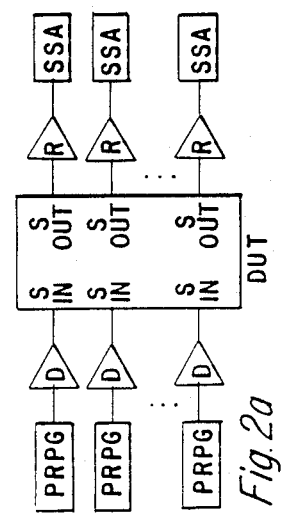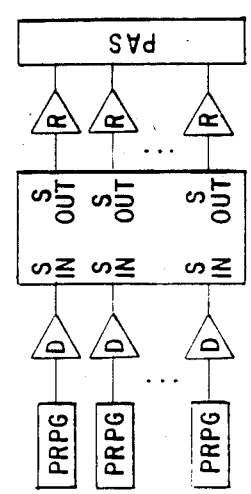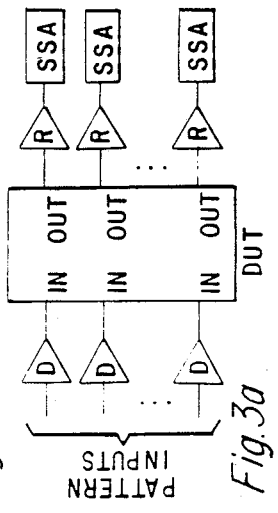

DISTRIBUTED PSEUDO RANDOM SEQUENCE CONTROL WITH UNIVERSAL POLYNOMIAL FUNCTION GENERATOR FOR LSI/VLSI TEST SYSTEMS

FIELD OF THE INVENTION

This invention relates to test systems and more particularly to polynomial function generators used in Large Scale Integrated (LSI) circuits and Very Large Scale Integrated (VLSI) circuits.

BACKGROUND OF THE INVENTION

As the level of semiconductor device integration grows, functional testing becomes an increasingly costly process. Complete functional verification of a complex integrated circuit is often impossible unless specific design methodologies are established to enhance the testability of the device. Many of the commonly accepted enhancement methods are based on the use of serial test patterns to exercise and monitor portions of the devices's internal logic. The complications associated with the test procedures and test system hardware needed to support these methods can be minimized if pseudo random test patterns are used to stimulate the device, and if signature analysis is used to compress many device response patterns into a single pattern, or signature.

Traditional deterministic testing requires the test system to store and manipulate many thousand of test patterns which describe both the device stimulus and expected response. This is accomplished with massive pattern memories and complex pattern sequence controllers, both of which contribute significantly to the costs of the test system. As LSI And VLSI devices become increasingly complex, these traditional test methods are becoming less effective for functional verification.

Functional verification is greatly enhanced by incorporating "scan paths" in the device design. Although various implementations exist, scan paths basically provide serial ports through which the device can be exercised and monitored. This enhances internal observability without adding eternal device test points (pins), except for the scan in/out pins. In this case, fewer parallel test patterns may be required, however the test system must be able to store and manipulate long serial test patterns.

A pseudo random serial scan test system is disclosed in IEEE INTERNATIONAL TEST CONFERENCE PROCEEDINGS, 1983 (ISBN 0-8186-0502-2, IEEE Catalog No. 1 83CH1933-1, Computer Society No. 502, Library of Congress No. 83-81805, pp. 283-287). The described test system is basically a modified conventional test system with a configurable (Linear Feedback Shift Registers) LFSR for pseudo random pattern generation, and a parallel input LFSR for signature analysis. Both LFSR's are shared resources, i.e. the serial pattern has to be addressed to be multiplexed. The signature comparison appears to be made with software.

SUMMARY OF THE INVENTION

The distributed pseudo random sequence control (DPRSC) system of the present invention supports pseudo random pattern generation and serial input signature analysis capability for each pin of a semiconductor device under test (DUT). This invention may be used in conjunction with the test system described and claimed in copending application Ser. No. 097,231 (TI-12737), filed Sept. 14, 1987, and entitled FUNCTION ARRAY SEQUENCING SYSTEM FOR VLSI TEST SYSTEM.

Linear Feedback Shift Registers (LFSR) are configurable to any characteristic polynomial and length up to 16 bits. Longer configurations are possible by chaining LFSR of adjacent pins. Parallel signature analysis with up to 16 bits between input terms is accomplished by chaining adjacent LFSR. The signature analysis circuit has match detection and anti-aliasing support.

A logic control circuit for a pin interface circuit of a test system incorporating DPRSC includes a receiver circuit (REC) which monitors a device under test while a driver circuit (DRV) stimulates an input of the device under test. The DUT output is sent via the receiver to a comparator and support circuitry where it is compared to patterns describing the expected device response. Pattern data that describes the DUT stimulus is formatted and applied to the DUT via the driver.

The DPRSC design is based on a universal polynomial function generator (UPFG). The UPFG is a reconfigurable LFSR with circuitry to support pseudo random pattern generation, parallel and serial signature analysis, and signature match detection.

To generate and apply pseudo random patterns to a DUT input, the UPFG is configured as a pseudo random pattern generator of any length and polynomial. The serial output of the UPFG is used as the data input to the driver formatter. When more than 16 stages (bits) are used for the generator, the UPFG of an adjacent tester may be used.

To encode a series of responses from a DUT output, the UPFG is configured as a serial input signature analyzer of any length and polynomial. The data from the receiver is sent to the serial input of the UPFG.

To encode a series of responses from multiple DUT outputs, UPFGs of several pin interfaces are cascaded. Each DUT output may be routed to any of 16 parallel inputs to the corresponding UPFG via a stage select decoder. The selector may also be used to vary signature analyzer input configurations to avoid signature aliasing.

Driver timing, receiver timing, and/or test cycle master timing may be selected for UPFG timing. This permits synchronization with other test pattern sources and facilitates dynamic mixing of stored and pseudo random patterns.

The technical advance represented by the invention as well as other objects and advantages will be apparent from the following description of an example of the invention when considered in conjunction with the accompanying drawings, and the novel features set forth in the appended claims.

BRIEF DESCRIPTION OF THE DRAWINGS

FIG. 1 illustrates a testing configuration for pseudo random serial scan testing;

FIGS. 2a and 2b illustrate testing configurations for simultaneous multiple scan path testing;

FIG. 3a illustrates a testing configuration for a first configuration for parallel deterministic device inputs with response data compression;

FIG. 3b illustrates a testing configuration for a second configuration for parallel deterministic device inputs with response data compression;

FIG. 4 illustrates a testing configuration for mixed testing;

DESCRIPTION OF A PREFERRED EMBODIMENT OF THE INVENTION

FIGS. 1–4 illustrate the various testing configurations that may be used in distributed pseudo sequencing control architecture. FIG. 1 illustrates serial scan testing. A device under test (DUT) has a serial scan input (S in) and a serial scan output (S out). A pseudo random pattern generator (PRPG) is used to generate and apply a pseudo random pattern to a device pin driver (D) which in turn applies the pattern to the DUT input. The DUT response is then relayed through a device pin receiver (R) to a serial signature analyzer (SSA).

Simultaneous scan path testing is illustrated in FIGS. 2a and 2b. FIG. 2a is essentially the same configuration as FIG. 1 except that more than one DUT serial scan input is utilized and then each serial scan output is processed through a separate receiver and serial signature analyzer.

FIG. 2b is the same configuration as illustrated in FIG. 2a except that the serial scan outputs of the DUT are processed, not individually in serial signature analyzers, but in a single parallel signature analyzer.

FIGS. 3a and 3b illustrate parallel deterministic device inputs with response data compression. In both FIGS. 3a and 3b, individual pattern inputs are applied to each pin input of the DUT through device pin drivers. The pin outputs of the DUT are processed through device pin receivers and applied to analyzers. In the configuration of FIG. 3a, individual analyzers are used for each signature, and in FIG. 3b, a parallel signature analyzer is used.

For mixed testing, both serial and parallel, a configuration such as that illustrated in FIG. 4 may be used. Both pseudo random pattern generator and pattern signals are applied to the pin inputs to the DUT. The pin outputs of the DUT are applied to either serial signature analyzers or parallel signature analyzers. Also illustrated is that one output may be connected to a stored pattern comparator.

Figure 5:
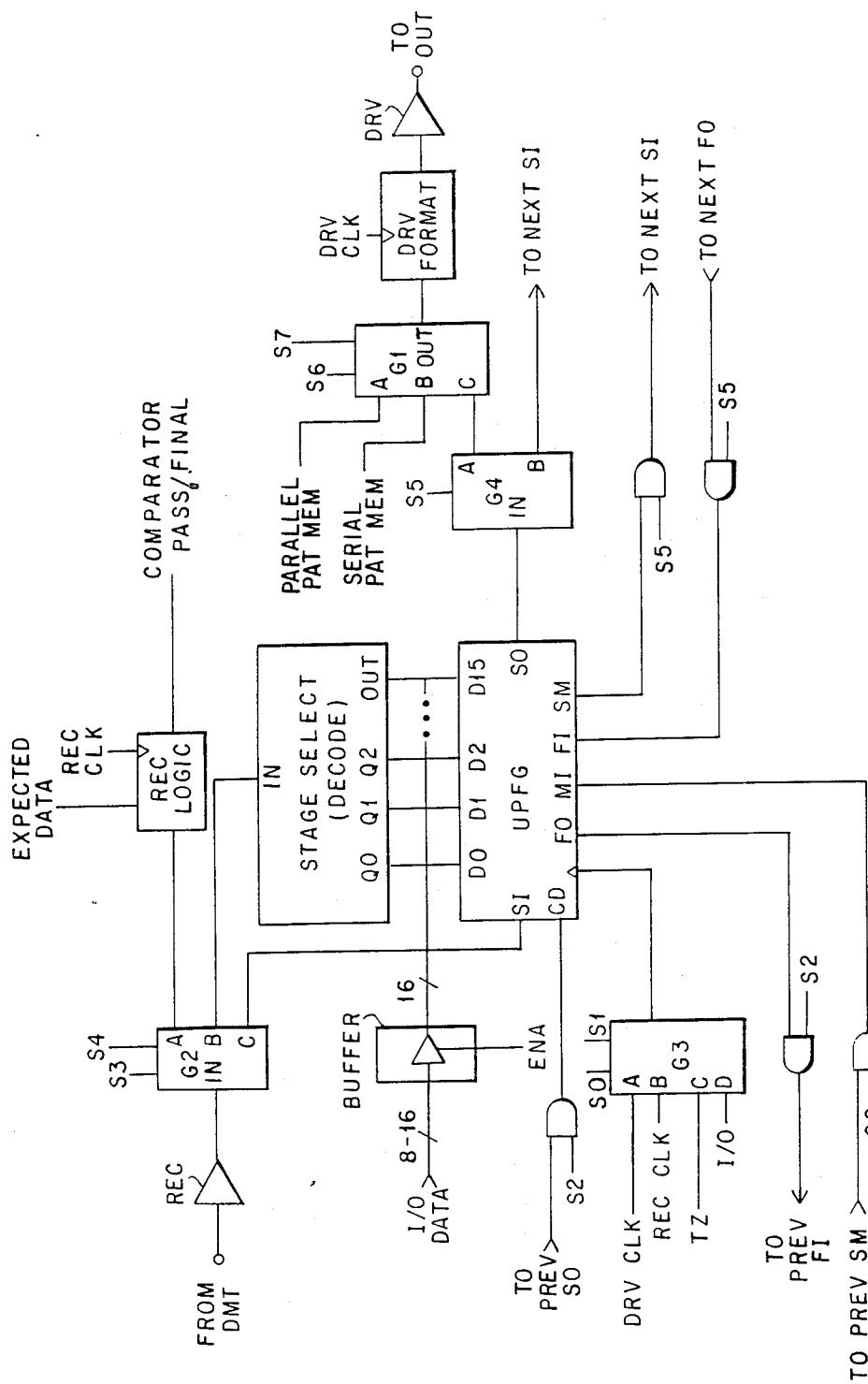
FIG. 5 illustrates pin interface logic for each pin of a device under test.

FIG. 5 illustrates the control logic for a pin interface circuit of a test system incorporating distributed pseudo random sequence control. Each, signal pin of the DUT is connected to a pin driver or receiver. The receiver circuit (REC) monitors DUT output, while the driver circuit (DRV) stimulates a DUT input. The DUT output is sent via the receiver (REC) to a comparator and support circuitry (REC LOGIC) where it is compared to patterns describing the expected device response.

Similarly, pattern data that describes the DUT stimulus is formatted (DRV FMT) and applied to the DUT via the driver circuit (DRV). The DPRSC circuit provides an alternate data source for the driver circuit, parallel pattern memory and serial pattern memory (G1), and two additional data destinations for received data, stage select (decode) and UPFG. The DPRSC design is based on a universal polynomial generator (UPFG), hereinafter described. The UPFG is basically a reconfigurable LFSR with circuitry to support pseudo random pattern generation, parallel and serial signature analysis, and signature match detection.

To generate and apply pseudo random patterns to a DUT input, the UPFG is configured as a pseudo random pattern generator of any length and any polynomial. The serial output of the UPFG (SO) is selected as the data input to the driver formatter (DRV FORMAT) by providing the required S6 and S7 signals as set forth in Table 1 discussed hereinbelow via gate G1. If more that 16 stages (bits) are needed for the generator, the UPFG of an adjacent pin interface may be cascaded by programming S5 on pin minus one and S2 on pin interface.

To encode a series of responses from a DUT output, the UPFG is configured as a serial input signature analyzer of any length and polynomial. The data from the receiver (REC) is sent to the serial input SI of the UPFG by providing the required S3 and S4 signals as set forth in Table 3 discussed hereinbelow via gate G2. If more that 16 stages are needed for the analyzer, the UPFG of an adjacent pin interface is cascaded.

To encode a series of responses from multiple DUT outputs, the UPFGs of several pin interfaces are cascaded. Each DUT output is routed to any of 16 parallel inputs to the corresponding UPFG (each of which being configured as a signature analyzer) via the stage select (decoder). This stage select (decode) can also be used to vary signature analyzer input configurations to avoid signature aliasing.

Driver timing (DRV CLK), receiver (RECCLK), or test cycle master timing (TZ) via gate G3 under control of signals S0 and S1 as set forth in Table 2 discussed hereinbelow may be selected for UPFG timing. DRVCLK and RECCLK may actually consist of individual timing edges. This allows synchronization with other test pattern sources and facilitates dynamic mixing of stored and pseudo random patterns. Timing edges may be synchronized or shifted as described and claimed in copending patent application Ser. No. 096,871 (TI-11131), filed Sept. 14, 1987, and entitled DYNAMIC TIMING REFERENCE ALIGNMENT SYSTEM.

Four tables are associated with FIG. 5. These tables are as follows:

TABLE 1

| S6 | S7 | DRIVER DATA SOURCE |
|----|----|--------------------|
| 0  | 0  | (PARALLEL) PATTERN MEMORY |
| 0  | 1  | (SERIAL) PATTERN |
| 1  | 0  | PSEUDO RANDOM GENERATOR |

TABLE 2

| S0 | S1 | CLOCK SELECT |
|----|----|--------------|
| 0  | 0  | DRIVER CLOCK |
| 0  | 1  | RECEIVER CLOCK |
| 1  | 0  | TZ |
| 1  | 1  | I/O CLOCK |

TABLE 3

| S3 | S4 | RECEIVER DATA DESTINATION |
|----|----|---------------------------|
| 0  | 0  | PASS/FAIL COMPARATOR |
| 0  | 1  | PARALLEL SIGNATURE ANALYZER |

TABLE 3-continued

| RECEIVER DATA DESTINATION | | |
|---|---|---|
| S3 | S4 | |
| 1 | 0 | SERIAL SIGNATURE ANALYZER |

TABLE 4

| PIN | FUNCTION |
|---|---|
| CD | Chain Data |
| CLK | Clock |
| S0,S1 | Function Selects |
| CLR | Clear Shift Register Data |
| CE | Clock Enable |
| FO | Feedback Out |
| D0-D3 | Data |
| SI | Serial Input |
| SO | Serial Output |
| SM | Signature Match output |
| MI | Signature Match input |
| FI | Feedback In |

Table 1 lists the logic for switching gate G1 to drive DRV Format to the DUT. The logical bit pattern determines which input goes to the DUT input, the serial pattern memory, the parallel pattern memory, or the pseudo random pattern.

Table 2 list the logic for the clock select. The four clock signals that may be selected by gate G3 are Driver clock (DRV CLK), Receiver clock (REC CLK), test cycle master timing (TZ) or an input/output (I/0).

Table 3 list the logic for gate G2 to determine which of the three devices is to receive the output from the DUT, the Pass/fail comparator, through the REC LOGIC, the Stage Select (Decode), or the UPFG.

Figure 7:
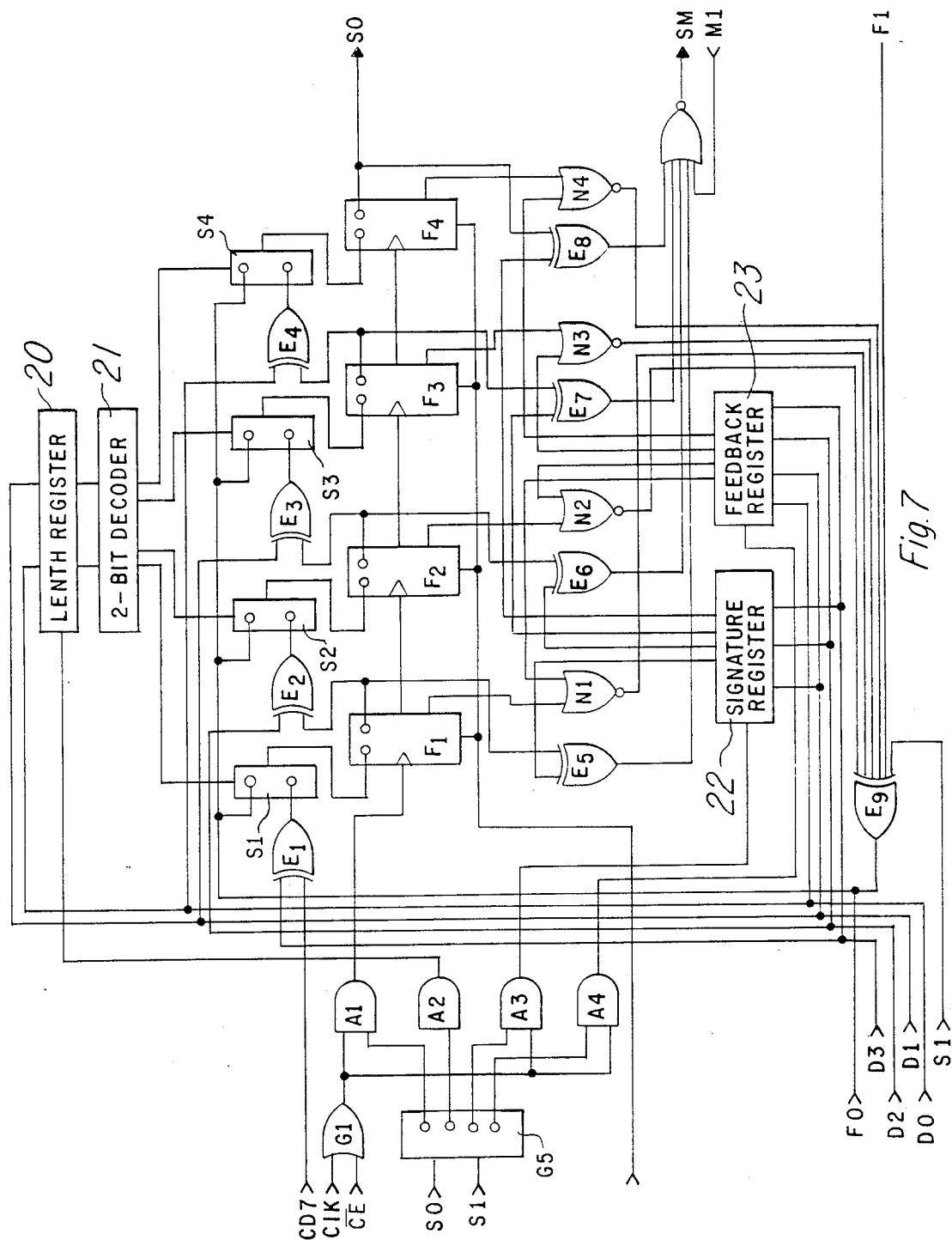
FIG. 7 illustrates a circuit configuration for a universal polynomial function generator.

Table 4 lists the input/outputs used in FIGS. 5 and 7. Input S5 to Gate G4 switches the output from the UPFG between the DRV Format (to the DUT input) or to the next serial input SI if more than 16 stages (bits) are needed. The S2 connections are used to chain from a previous stage. The other designated input/outputs are used in conjunction with the other inputs/outputs for the circuit in FIGS. 5 and 7.

The preferred embodiment of the circuit herein is set forth in FIG. 5, FIG. 7 setting forth a circuit which can perform the functions of the UPFG block and stage select circuit of FIG. 5. With reference to FIG. 5, except of the UPFG circuit which is shown in detail in FIG. 7, each of the elements is a well known circuit.

As is readily apparent from FIG. 5 taken in conjunction with Tables 1 to 4, the output of the DRV circuit provides the predetermined input to the DUT as shown in any one of FIGS. 1 to 4, the DRV FORMAT circuit driving the DRV circuit being clocked in accordance with a DRV CLK signal which is also input to gate G3. The output of gate G3 is controlled by the S0 and S1 signals as shown in Table 2 to provide to the UPFG clock input one of the input signals thereto.

The DRV FORMAT circuit receives a signal from gate G1, gate G1 being controlled by the S6 and S7 signals as shown in Table 1 to provide to the DRV FORMAT circuit one of the inputs thereto. The signal from the UPFG is provided through gate 4 to input "C" of gate 1 when gate G4, which is controlled by the S5 signal, is in the "A" position. The UPFG provides the desired signal to the DUT as fully explained in the specification, partially in conjunction with the discussion of FIGS. 6a and 6b via gates G2 and G1 and the DRV FORMAT and DRV circuits as explained hereinabove.

The output of the DUT as a result of the input thereto as explained hereinabove is received at the REC circuit and fed via gate G2 to one of the outputs thereof under control of the S3 and S4 signals as shown in Table 3. Accordingly, if the "A" output thereof is selected, the REC LOGIC circuit under control of the REC CLK signal will compare the input thereto of the expected data to be received and the data from gate 2 to provide a comparator pass/fail signal. If gate 2 output "B" is selected, then the output travels to an input of stage select, is decoded therein and then signals therefrom are sent to the UPFG for analysis and use as discussed in the specification. If gate 3 output "C" is selected, then the output travels to the SI input of the UPFG as a serial input for use as discussed in the specification.

Linear feedback shift registers (LFSR) may be configured for various application in logic testing and data transmission. They are particularly useful as the fundamental circuits in pseudo random test pattern generators and signature analyzers. LFSR based circuits are normally tailored to meet specific applications. Because of the similarity and simplicity of these types of circuits, a single programmable universal LFSR design may be used in nearly all common applications, while needing little or no additional specific circuitry. Such circuits are simple enough to reside on a single 24 pin ECL integrated circuit.

Figure 6A:
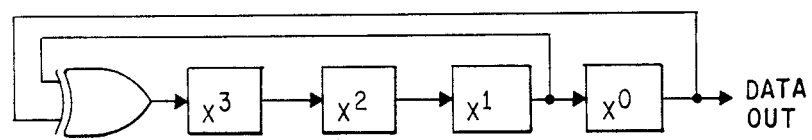
FIGS. 6a and 6b illustrate linear feedback shift register applications.
Figure 6B:
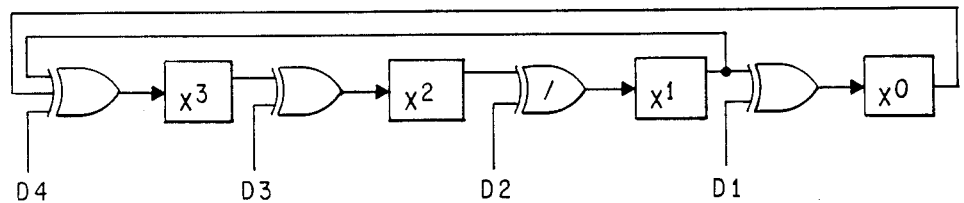

Linear feedback shift registers are basically shift registers with the outputs of particular stages combined in a linear fashion (modulo 2 addition) and presented to the input of a previous stage. Two configurations of LFSR are illustrated in FIGS. 6a and 6b. FIG. 6a illustrates a LFSR configured as a 4-bit pseudo random pattern generator the output of which is represented by the polynomial $P(x)=X+X+1$. FIG. 6b illustrates a LFSR configured as a 4-bit parallel/serial signature analyzer. There are four data inputs, D1, D2, D3 and D4. To be used for serial operation, inputs D1-D3 are 0.

The length of the shift register and the output states chosen for feedback terms define the characteristic polynomial of the LFSR. The characteristic polynomial varies for different applications. The application also determines whether the LFSR will be used to generate data (pseudo random pattern generator) or encode data (signature analysis). A generator is usually initialized with a "seed" and then sequenced. The encoder operates differently in that the data to be encoded is merged linearly with the intermediate shift register content during sequencing, resulting in a unique shift register content at the end of the sequence. Universal polynomial function generators (UPFG) include all circuitry to configure an LFSR of any length and characteristic polynomial. For lengths longer than 8 bits, UPFGs may be directly cascaded. Each UPFG includes internal circuitry to support polynomial degree (LFSR length) select, feedback term select, shift register initialization, pseudo random serial pattern output, serial or parallel signature analysis input, and signature comparison.

FIG. 7 illustrates a four bit version of a UPFG circuit. The design may be expanded to any size by adding more intermediate stages, however an eight bit version is most convenient to integrate into a standard 24 pin package.

The circuit is built around an LFSR formed by cascaded D-type flip flops F1, F2, F3 and F4. Each stage may select its input either from the feedback term from feedback register 23 or the output from the previous stage via gates E1, E2, E3, or E4. Only one of the four stages per configuration is allowed to select the feedback term. This defines the length of the LFSR.

The output of each stage is linearly merged with an external input. This enables the device to operate as a serial or parallel input signature analyzer. These inputs will normally be low for other pattern generator applications. The inverted output of each stage may be selected (selector switches S1–S4 and inverted again) as feedback terms to form the characteristic polynomial. Any combination of feedback terms may be selected.

The outputs of all stages may also be compared to a stored register value (signature register 22) to indicate a signature match. The device is programmed using the data inputs to load the length select register 20, feedback term select register 23, and signature register 22 if needed. Output from the UPFG is via gate E9. Inputs are through AND gates A1–A4 and Gate G1 UPFGs as illustrated in FIG. 7 may be cascaded to form longer registers by connecting the SO, SM, and FI pins of one UPFG to the CD, MI, and FO pins of the next UPFG. The CE pin allows selective register loading of each cascaded device. The definitions of the pin designators used in FIG. 7 are as follows: CD is used to chain data from a previous stage, CLK is the clock input, SO and SI are the function select pins, FO is feedback out to previous stage, D0–D3 is data in, SI is serial input, SO is serial output, CE is clock enable, SM is signature output and MI is signature from previous stage. The logic for switching the input of gate G5 to determine the specific function selected is a follows: SO,SI: 0,0 - shift/load shift register; 0,1 - load length; 1,0 -load signature; and 1,1 - load feedback term. UPFGs defined above may be used in advanced semiconductor test equipment as very high performance, programmable test pattern generators and signature analyzers. Such devices are easily implemented using ECL semiconductor technology.

What is claimed:

1. In a test system for testing a large integrated circuit device under test having plural input and plural output pins,
   a distributed pseudo random test pattern generation and encoded response analysis system having a clock input for use with said device under test, said distributed pseudo random test pattern generation and encoded response analysis system comprising for each of said input and output pins:
   a universal polynomial function generator coupled to a predetermined one of said input pins and a predetermined one of said output pins of said device under test,
   a first gate circuit for connecting said function generator to at least one of said input pins of said device under test,
   a second gate circuit for connecting said function generator to said predetermined one of said output pins of said device under test,
   a third gate circuit for interconnecting a clock input of said function generator to one of a plurality of clock/timing signals, and
   a stage select circuit for configuring said function generator
   a plurality of NAND circuits connected to a plurality of input/output terminals of said function generator for cascading several said function generators.

2. The analysis system according to claim 1, wherein the function generator is a universal polynomial function generator configurable to generate a polynomial to any bit length and any characteristic polynomial.

3. The analysis system according to claim 1, wherein said first gate supplies inputs to the device under test from any one of at least three sources.

4. The analysis system according to claim 3, wherein said at least three sources include a parallel pattern memory, a serial pattern memory, and the analysis system.

5. The analysis system according to claim 1, wherein said second gate outputs data from the device under test to at least three different devices.

6. The analysis system according to claim 5, wherein the three different devices include a stage select circuit, a universal polynomial function generator, and a receive logic comparison circuit.

7. The analysis system according to claim 1, wherein said function generator is a programmable linear feedback shift register.

8. The analysis system according to claim 1, wherein said function generator includes circuitry to select a polynomial of a desired degree.

9. The analysis system according to claim 1, wherein said function generator includes circuitry to select feedback term select.

10. The analysis system according to claim 1, wherein said function generator includes circuitry to generate a pseudo random serial pattern output.

11. The analysis system according to claim 1, wherein said function generator includes circuitry to support serial and parallel signature analysis input.

12. The analysis system according to claim 1, wherein said function generator includes circuitry to support signature comparison.

13. In a test system for testing a large integrated circuit device under test having input pins for receiving input test signals and output pins for providing an output responsive to said input test signals indicative of device under test operation,
   a distributed pseudo random test pattern generation and encoded response analysis circuit for use with a device under test, said distributed pseudo random test pattern generation and encoded response analysis circuit comprising for each of said input and output pins:
   a universal polynomial function generator,
   an input circuit connecting said function generator to a said input pin of said device under test,
   a clock select gate for inputting at least one of plural different clock signals to said function generator,
   an output circuit connected to a said output pin of said device under test, and
   a stage select circuit connected to said output circuit and said universal polynomial function generator to vary inputs from said device under test to said function generator.

14. The analysis system according to claim 13, including a data buffer connected to the function generator for receiving data to configure the analysis system as a pseudo random pattern generator.

15. The analysis system according to claim 13, including a data buffer connected to the function generator for receiving data to configure the analysis system as a signature analysis program system.

16. The analysis system according to claim 13, including gate circuits for cascading several function generators to encode a series of responses from multiple devices under test.

17. The analysis system according to claim 13, wherein the clock select gate allows synchronization with other test pattern sources and facilitates dynamic mixing of stored and pseudo random patterns.

18. The analysis system according to claim 13, wherein the analysis circuit and device under test may be connected for pseudo random serial scan testing.

19. The analysis system according to claim 13, wherein the analysis circuit and device under test may be connected for simultaneous scan path testing.

20. The analysis system according to claim 13, wherein the analysis system and device under test may be connected for parallel deterministic device inputs with response data compression.

21. The analysis system according to claim 13, wherein the analysis circuit and device under test may be connected for mixed testing with pattern and pseudo random pattern generation and serial signature analysis and stored pattern comparison.

22. In a test system for testing a large integrated circuit device under test having input pins and output pins,
- a distributed pseudo random test pattern generation and encoded response analysis system for use with said device under test, said distributed pseudo random test pattern generation and encoded response analysis system comprising for each of said input and output pins:
- a universal polynomial function generator coupled to a predetermined one of said input pins and a predetermined one of said output pins of said device under test,
- a first gate circuit for connecting said function generator to said input pin of said device under test, and
- a second gate circuit for connecting said function generator to said output pin of said device under test.

* * * * *